Dec. 29, 1959 W. S. WOOD 2,919,410
PHASE SHIFT COMPENSATING NETWORK
Filed Feb. 4, 1957
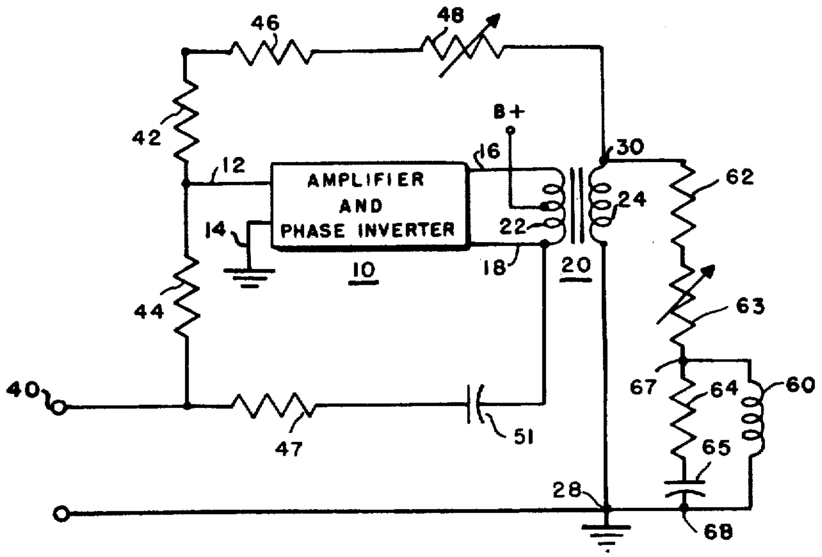
INVENTOR.
WILLIAM S. WOOD
BY Harry M. Saragovitz
ATTORNEY United States Patent Office 2,919,410 Patented Dec. 29, 1959

2,919,410

PHASE SHIFT COMPENSATING NETWORK

William S. Wood, Wall Township, N.J., assignor to the United States of America as represented by the Secretary of the Army Application February 4, 1957, Serial No. 638,178

2 Claims. (Cl. 330—117)

(Granted under Title 35, U.S. Code (1952), sec. 266)

The invention described herein may be manufactured and used by or for the Government for governmental purposes, without the payment of any royalty thereon.

This invention relates to amplifiers and particularly to amplifiers having feedback networks. More particularly, this invention relates to amplifiers whose gain is controlled by feedback networks.

One of the main problems in power amplifiers that use a large amount of feedback is the effect of phase shift in the output due to the inductance of the load. This phase shift may make precise feedback gain impossible since feedback for such control purposes must be either in phase with or 180° out of phase with the input signal. Any quadrature difference of phase between the input signal and the feedback voltage will generate quadrature error signals which will add undesirable power to the output load and destroy the efficiency of the amplifier.

It is, therefore, an object of this invention to compensate for the phase shift due to large inductive loads in the output circuit of an amplifier.

It is a further object of this invention to provide an output load compensating network to be used in conjunction with feedback networks.

These objects are accomplished by means of resistive and capacitive elements connected across the output load to partially compensate for the inductance of the output load and a variable resistive connection between the secondary of the output transformer and the partially compensated load to provide a precise compensation.

The invention will be described more particularly and other and further objects of this invention will become apparent from the following specification taken in conjunction with the drawing which shows a circuit diagram of an amplifier with feedback networks, compensated in accordance with my invention.

Referring more particularly to the drawing, an amplifier and phase inverter 10 has a single-sided input connected between terminal 12 and the grounded point 14. The push-pull output of the amplifier across terminals 16 and 18 is shown connected to the primary winding 22 of an output transformer 20, which may be coupled to a source of positive potential in a conventional manner. The secondary winding 24 of the transformer is shown with one terminal 28 grounded and the other terminal 30 connected to the output load 60 through the compensating network 62 through 65.

The feedback network of this amplifier includes resistors 42 through 48 which form a voltage dividing network between the output terminal 30 and one side 18 of the amplifier output. The coupling condenser 51 keeps the positive voltage from the feedback network. The input 12 is at one point near the center of this voltage dividing network. The source of signals to be applied to the amplifier is connected between the ground point 28 and a terminal 40 on the positive feedback side of the network. The positive feedback is applied through condenser 51.

In order to compensate for the phase shifting effect of inductive load 60 on the feedback voltage, a condenser 65 is connected in series with a resistor 64 across the terminals 67 and 68 of the load to form a tank circuit. The value of the condenser is chosen to make the tank circuit resonant at the frequency at which the amplifier is to be used. The resistor 64 provides a damping factor to maintain the load at a relatively low impedance by reducing resonant currents that would build up in the tank circuit.

Since the combination of condenser and resistor alone will be effective only for a particular inductive load, the resistors 62 and 63, one of which should be variable, are connected between the ungrounded load terminal 67 and the ungrounded output terminal 30. These resistors vary the coupling between the inductances of the output transformer and the load and in turn control the total effective inductance of the tank circuit. That is to say that, while the principal reactive components of the tuned circuit consist of the coil 60 and the condenser 65, the inductance of transformer secondary winding 24 is electrically connected in parallel with these reactive components through resistances 62 and 63 to act as an auxiliary reactive component of the tuned circuit. When the resistances 62 and 63 are high, the effect of the inductance 24 on the tuned circuit will be negligible, but when the resistances are relatively low the inductance 24 will be effectively connected across the tuned circuit to decrease the total inductance of the tuned circuit and change its frequency correspondingly. The variable resistor thereby tunes the resonant frequency of the tank circuit over a narrow range, making it present a purely resistive load to the output circuit. Under these conditions the feedback voltage at 30 will be exactly 180° out of phase with the positive feedback from point 18 and the input signals at 40.

For an inductive load of ¼ henry, a value of .6 microfarad should be used for the condenser 65. The resistance 64 should be about 220 ohms while the resistors 62 and the variable resistance 63 should be 3 and 5 ohms respectively. In the feedback network resistances 42 and 44 are 470,000 ohms each; resistance 46 is 3,900 ohms; resistance 47 is 300,000 ohms; and the variable resistor 48 is 5,000 ohms. The condenser 51 should be one microfarad. The amplifier and its associated output transformer will be standard components suitable for the amount of power required. These values are chosen for use at a frequency of 400 cycles.

Having thus described my invention, what is claimed is:

1. A phase shift compensating circuit for a fixed frequency amplifier with a transformer coupled output having a pair of output terminals with one terminal grounded and a pair of input terminals with one terminal grounded comprising; a feedback network connecting the other of said output terminals to the other of said input terminals; and a phase shifting network comprising a variable resistance and an inductance connected in series, and a condenser and a resistor connected in series across said inductance to form a damped tuned circuit resonant at said fixed frequency; said phase shifting network connected across said pair of output terminals; said tuned circuit being tunable over a narrow range by means of said variable resistance.

2. A phase shift compensating circuit for a fixed frequency amplifier with a transformer coupled output having a pair of output terminals with one terminal grounded and a pair of input terminals with one terminal grounded comprising; a feedback network connecting the other of said output terminals to the other of said input terminals, an inductive load; a condenser and a resistor connected in series across said inductive load to form a damped tuned circuit resonant at said fixed frequency, the junction of said condenser and said inductive load being grounded; and a variable resistance connecting the junction of said resistor and said inductive load to said other of said output terminals, said tuned circuit being tunable over a narrow range by means of said variable resistance.

References Cited in the file of this patent

UNITED STATES PATENTS

| | | |
|---|---|---|
| 2,068,112 | Rust | Jan. 19, 1937 |
| 2,181,865 | Black | Dec. 5, 1939 |
| 2,214,627 | Rothe et al. | Sept. 10, 1940 |
| 2,216,465 | Wilhelm | Oct. 1, 1940 |
| 2,220,770 | Mayer | Nov. 5, 1940 |
| 2,226,945 | Rocard | Dec. 31, 1940 |
| 2,241,925 | Roche | May 13, 1941 |
| 2,255,690 | Wheeler | Sept. 9, 1941 |
| 2,629,819 | Dome | Feb. 24, 1953 |